(12) United States Patent
Radke et al.

(10) Patent No.: US 8,661,312 B2
(45) Date of Patent: **\*Feb. 25, 2014**

(54) ERROR DETECTION AND CORRECTION SCHEME FOR A MEMORY DEVICE

(75) Inventors: William H. Radke, San Francisco, CA (US); Shuba Swaminathan, Los Gatos, CA (US); Brady L. Keays, Half Moon Bay, CA (US)

(73) Assignee: Micron Technology, Inc., Boise, ID (US)

( * ) Notice: Subject to any disclaimer, the term of this patent is extended or adjusted under 35 U.S.C. 154(b) by 365 days.

This patent is subject to a terminal disclaimer.

(21) Appl. No.: 13/080,299

(22) Filed: Apr. 5, 2011

(65) Prior Publication Data

US 2011/0185254 A1   Jul. 28, 2011

Related U.S. Application Data

(60) Continuation of application No. 11/706,506, filed on Feb. 15, 2007, now Pat. No. 7,930,612, which is a division of application No. 10/769,001, filed on Jan. 30, 2004, now Pat. No. 7,389,465.

(51) Int. Cl.
*H03M 13/00* (2006.01)
(52) U.S. Cl.
USPC .......................................... 714/755

(58) Field of Classification Search
USPC ........................ 714/755, 763, 773, 777, 782
See application file for complete search history.

(56) References Cited

U.S. PATENT DOCUMENTS

| | | | |
|---|---|---|---|
| 4,005,405 | A | 1/1977 | West |
| 4,716,566 | A | 12/1987 | Masuhara |
| 4,716,567 | A | 12/1987 | Ito |
| 5,357,527 | A | 10/1994 | Coates |
| 5,754,563 | A | 5/1998 | White |
| 5,754,753 | A | 5/1998 | Smelser |
| 6,003,151 | A | 12/1999 | Chuang |
| 6,651,212 | B1 | 11/2003 | Katayama |
| 6,769,087 | B2 | 7/2004 | Moro |
| 7,231,585 | B2 | 6/2007 | Vainsencher |
| 7,389,465 | B2 * | 6/2008 | Radke et al. ................. 714/755 |

\* cited by examiner

*Primary Examiner* — Shelly A Chase
(74) *Attorney, Agent, or Firm* — Leffert Jay & Polglaze, P.A.

(57) ABSTRACT

Data is read from a memory array. Before being stored in a data buffer, a Hamming code detection operation and a Reed-Solomon code detection operation are operated in parallel to determine if the data word has any errors. The results of the parallel detection operations are communicated to a controller circuit. If an error is present that can be corrected by the Hamming code correction operation, this is performed and the Reed-Solomon code detection operation is performed on the corrected word. If the error is uncorrectable by the Hamming code, the Reed-Solomon code correction operation is performed on the word.

19 Claims, 3 Drawing Sheets

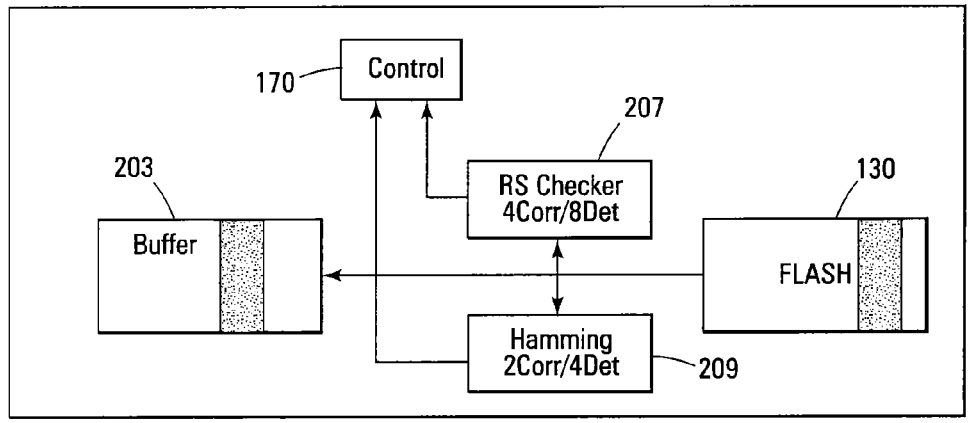
Fig. 2
| Hamming | RS | Action |
|---|---|---|
| OK | OK | No error, return data from buffer. |
| CE | Error | Correct data in buffer using Hamming info, then rerun results through RS Checker: if okay, return data; else run RS correction algorithm. Diagram 2. |
| UE | Error | Run RS correction algorithm. |
| Error | OK | Error in Hamming syndrome bits: return data from buffer. |
| OK | Error | Run RS correction algorithm. |
Fig. 3
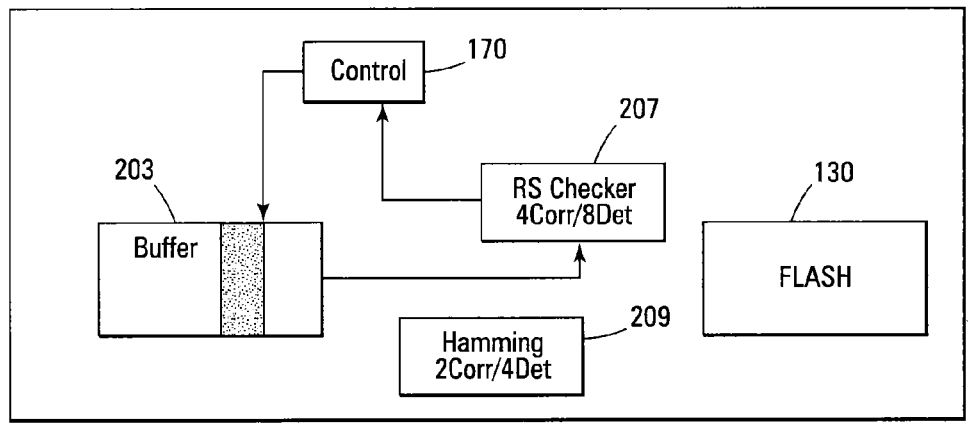
Fig. 4

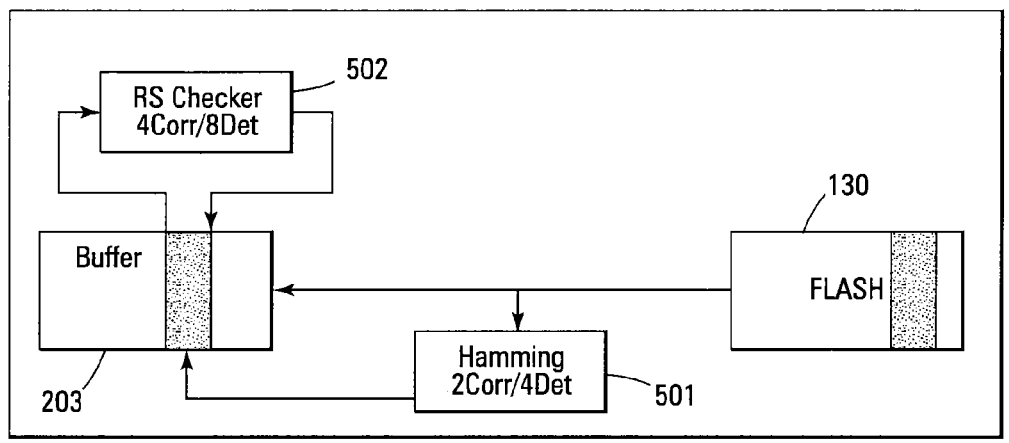
*Fig.* 5
| Hamming | RS | Action |
|---|---|---|
| OK | Not invoked | No error, return data from buffer. |
| CE | Invoked | Correct data in buffer using Hamming info, then rerun results through RS Checker. |
| UE | Invoked | Hamming does not update contents of bufffer. Run RS correction algorithm. |
*Fig.* 6

US 8,661,312 B2

ERROR DETECTION AND CORRECTION SCHEME FOR A MEMORY DEVICE

RELATED APPLICATIONS

This application is a continuation of U.S. application Ser. No. 11/706,506, titled "ERROR DETECTION AND CORRECTION SCHEME FOR A MEMORY DEVICE", filed Feb. 15, 2007, now U.S. Pat. No. 7,930,612 issued Apr. 19, 2011, which is a divisional application of U.S. application Ser. No. 10/769,001, filed Jan. 30, 2004, now U.S. Pat. No. 7,389,465, titled "ERROR DETECTION AND CORRECTION SCHEME FOR A MEMORY DEVICE," issued Jun. 17, 2008, which are commonly assigned and the entire contents of which are incorporated herein by reference.

TECHNICAL FIELD

The present invention relates generally to memory devices and in particular the present invention relates to error correction in memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

A typical flash memory comprises a memory array, which includes a large number of memory cells. The flash memory is differentiated from other non-volatile memory in that flash memory cells can be erased and reprogrammed in blocks instead of one byte at a time.

Flash memory devices typically have some type of error detection and correction that provides greater reliability. For example, if a design in which the memory device is implemented is electrically noisy but requires high reliability (e.g., automobile antiskid braking system), some type of error detection and correction would be necessary to increase the reliability that the data in the memory is actually what was stored by the processor or other controller.

Error correction schemes that are used in memory devices include Hamming or Reed-Solomon codes. However, each of these schemes has drawbacks. The Hamming code is faster than many error correction schemes but is not as robust. The Reed-Solomon code is very robust but is relatively slow.

For the reasons stated above, and for other reasons stated below which will become apparent to those skilled in the art upon reading and understanding the present specification, there is a need in the art for a more efficient and robust error detection and correction scheme in memory devices.

BRIEF DESCRIPTION OF THE DRAWINGS

FIG. 2 shows a block diagram of one embodiment of an error detection and correction scheme for a memory device in accordance with the present invention.

FIG. 3 shows a table of results and accompanying actions resulting from the error detection in accordance with the embodiment of FIG. 2.

FIG. 4 shows a block diagram of an embodiment of a Reed-Solomon code error correction scheme for a memory device in accordance with the embodiments of FIGS. 2 and 3.

FIG. 5 shows a block diagram of another alternate embodiment of an error detection and correction scheme for a memory device in accordance with the present invention.

FIG. 6 shows a table of results and accompanying actions resulting from the error detection in accordance with the embodiment of FIG. 5.

DETAILED DESCRIPTION

Figure 1:
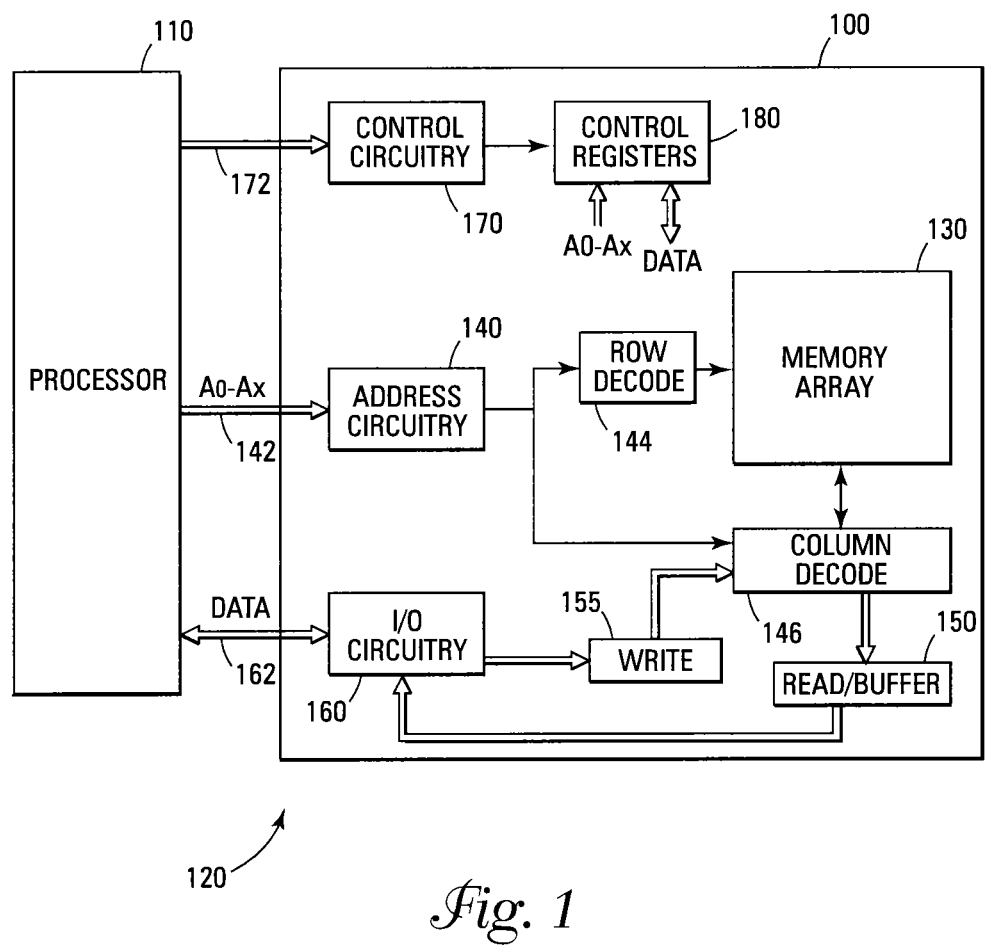
FIG. 1 shows a block diagram of one embodiment of an electronic system of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

The following embodiments of the present invention are discussed with reference to a flash memory device, including both NAND and NOR-type flash devices. However, the present invention is not limited to any one type of memory device. Any memory device that would benefit from an error detection and correction scheme is encompassed by the present invention.

FIG. 1 illustrates a functional block diagram of a memory device 100 of one embodiment of the present invention that is coupled to a processor 110. The processor 110 may be a microprocessor, a processor, or some other type of controlling circuitry. The memory device 100 and the processor 110 form part of an electronic system 120. The memory device 100 has been simplified to focus on features of the memory that are helpful in understanding the present invention.

The memory device includes an array of memory cells 130. In one embodiment, the memory cells are non-volatile floating-gate memory cells and the memory array 130 is arranged in banks of rows and columns.

An address buffer circuit 140 is provided to latch address signals provided on address input connections A0-Ax 142. Address signals are received and decoded by a row decoder 144 and a column decoder 146 to access the memory array 130. It will be appreciated by those skilled in the art, with the benefit of the present description, that the number of address input connections depends on the density and architecture of the memory array 130. That is, the number of addresses increases with both increased memory cell counts and increased bank and block counts.

The memory device 100 reads data in the memory array 130 by sensing voltage or current changes in the memory array columns using sense/buffer circuitry 150. The sense/buffer circuitry, in one embodiment, is coupled to read and latch a row of data from the memory array 130. Data input and output buffer circuitry 160 is included for bi-directional data communication over a plurality of data connections 162 with the controller 110). Write circuitry 155 is provided to write data to the memory array.

Control circuitry 170 decodes signals provided on control connections 172 from the processor 110. These signals are used to control the operations on the memory array 130, including data read, data write, and erase operations. In one embodiment, the control circuitry 170 executes the error detection and correction schemes of the present invention. The control circuitry 170 may be a state machine, a sequencer, or some other type of controller.

The flash memory device illustrated in FIG. 1 has been simplified to facilitate a basic understanding of the features of the memory. A more detailed understanding of internal circuitry and functions of flash memories are known to those skilled in the art.

FIG. 2 illustrates a block diagram of one embodiment of an error detection and correction scheme for a memory device. This embodiment uses both the Hamming code and Reed-Solomon code error detection in parallel with the read operation to take advantage of the attributes of each scheme.

A Hamming code is an error detecting and error correcting binary code. Hamming codes can detect two bit errors and correct one bit error and are capable of immediately detecting whether the error is correctable. A Hamming code satisfies the relationship $2^m \geq n+1$, where n is the total quantity of bits in the memory block, k is the quantity of information bits in the block, and m is the quantity of check bits in the block such that m=n−k. Since the correction scheme of the present invention uses two Hamming codes, one or two errors can be corrected and up to four can be detected. Hamming codes are well known in the art and are not discussed further.

A Reed-Solomon code is an algebraic code that belongs to a class of Bose-Chaudhuri-Hocquenghem (BCH) multiple burst correcting cyclic codes. The Reed-Solomon code operates on bytes of fixed length. Given m parity symbols, a Reed-Solomon code can correct up to m byte errors in known positions that are also referred to as erasures. It can also detect and correct up to m/2 byte errors in unknown positions. In one embodiment, the Reed-Solomon code can immediately detect eight byte errors and correct four byte errors but typically requires some time to determine whether the errors are correctable. Reed-Solomon codes are well known in the art and are not discussed further.

The embodiment of FIG. 2 includes the flash memory array 130 as described above with reference to FIG. 1. The operation of these cells is well known in the art and is not discussed further.

A data buffer 203 is coupled to the flash memory array 130. The data buffer 203 is used by the memory controller circuit to store data after a read operation. The buffer may be the read/buffer 150 of FIG. 1, memory in the controller circuit 170, or some other temporary memory for storing data read from the memory array 201.

The controller circuit 170 is responsible for performing the read operations and execution of the embodiments of the error detection and correction schemes of the present invention. The controller circuit 170 also executes the Reed-Solomon and Hamming code error detection and correction operations.

The method illustrated in FIG. 2 performs a read operation into the buffer 203. As the data is being read out of the memory array 201, it is simultaneously checked by both the Reed-Solomon 207 and Hamming 209 code checkers. The results from these error detection routines 207 and 209 are passed to the controller circuitry 170 in order to determine the next course of action.

FIG. 3 illustrates a table that lists the combinations of results from each of the error detection routines 207 and 209 of FIG. 2. Along with each combination of results is an action that is performed in response to that error detection combination.

The first set of results is when both the Hamming code error detection and the Reed-Solomon code error detection determine that no errors exist in the data going to the buffer. In this case, the data is returned from the buffer to the memory array. Alternate embodiments may perform other tasks with the error-free data such as permitting the data to be read out of the buffer by a system controller coupled to the memory device.

If the Hamming code error detection experiences a correctable error and the Reed-Solomon code error detection experiences an error, the data is corrected in the buffer by the Hamming code correction method. The results of this correction operation are then run through the Reed-Solomon code error detection method again. If the error has been corrected, the data is returned to the memory array. If the error has not been corrected, the Reed-Solomon code correction method is then used as illustrated in FIG. 4.

FIG. 4 illustrates a block diagram of the Reed-Solomon code correction method 207 after a detected error could not be corrected by the Hamming code error correction method 209. The data is read from the buffer 203 and processed by the Reed-Solomon code correction method 207. The results are sent to the controller circuitry 170 that returns the data to the buffer 203 if the errors were corrected. If the errors were not corrected, the data is permanently corrupted and flagged as such.

Referring again to FIG. 3, the Hamming code error detection may detect an uncorrectable error (UE). This is an error that is beyond its error correction capabilities as described above. If the Reed-Solomon code error detection also detects an error, the Reed-Solomon code error correction method is used.

If an error is detected by the Hamming code error detection method but the error is not detected by the more accurate Reed-Solomon code error detection method, something is wrong with the Hamming code syndrome bits. In this case, the data is probably does not have an error and it is returned from the buffer to the memory array.

If an error is not detected by the Hamming code error detection method but an error is detected by the Reed-Solomon code error detection method, the Reed-Solomon code error correction method is used to correct the error as illustrated in FIG. 4.

FIG. 5 illustrates a block diagram of another embodiment of the error detection and correction scheme for a memory device in accordance with the present invention. This embodiment performs a serial error correction with the memory read operation.

Data is loaded from the flash memory array 130 into the buffer 203 as part of a read operation. As the data is loaded, it is checked and corrected, if necessary, using the Hamming code error detection method 501. If any errors are discovered during the error detection 501, the Reed-Solomon code error detection method 502 is invoked. If necessary, the Reed-Solomon code error correction method 502 is performed.

FIG. 6 illustrates a table of results and accompanying actions resulting from the error detection in accordance with the embodiment of FIG. 5. If the Hamming code error detection method does not find an error, the Reed-Solomon code correction/detection method is not invoked.

If the Hamming code error detection method finds a correctable error, the Reed-Solomon code correction method is invoked to correct the data in the buffer using the Hamming correction data. The results from this operation are then run through the Reed-Solomon code error detection method again. The corrected data is then returned to the memory array from the buffer.

If the Hamming code error detection method finds an error that cannot be corrected using the Hamming code error correction method, the Reed-Solomon code error correction method is invoked. In this case, the Hamming correction data is not used by the Reed-Solomon code error correction method. The corrected data is then returned to the memory array from the buffer.

The above-described invention is discussed using the Hamming code and Reed-Solomon code as the error detection and correction algorithms. However, the present invention is not limited to any one error detection and/or correction code.

CONCLUSION

In summary, the embodiments of the error detection and correction method in a memory device provide a robust and efficient way to improve data reliability in a memory device. This is accomplished by using both the Hamming code and Reed-Solomon code error detection, either in parallel or in series with the data read operation. The repair operations then require very little overhead to perform.

In one embodiment, data is read from the memory array. A first error detection operation is performed in parallel with a second error detection operation on the read data. The results of the two error detection operations are reported to the controller. The error corrected data is stored in the data buffer.

In another embodiment, a first error detection operation is performed as the data is loaded into a data buffer. If an error is detected that can be corrected by a first error correction operation, that operation is performed and a second error detection operation is used on the corrected data word. If the error is uncorrectable by the first error correction operation, the second error correction operation is used on the data word.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for error detection and correction in a memory device having a memory array, the method comprising:
    reading data from the memory array;
    performing first and second error detection operations substantially in parallel; and
    if the first error detection operation detects an error that is uncorrectable by a first error correction operation and the second error detection operation detects the error, correcting the error with a second error correction operation.

2. The method of claim 1 wherein the first error detection operation is a Hamming code error detection and the second error detection operation is a Bose-Chaudhuri-Hocquenghem (BCH) multiple burst correcting cyclic code.

3. The method of claim 2 wherein BCH cyclic code is configured to correct up to m byte errors in known erasures wherein m is a number of parity symbols.

4. The method of claim 2 wherein the BCH cyclic code is configured to correct up to m/2 byte errors in unknown erasures wherein m is a number of parity symbols.

5. The method of claim 4 and further comprising:
    if an error has been detected in the read data or the error has been corrected, storing the data back to the memory array.

6. A method for error detection and correction in a memory device having a memory array, the method comprising:
    reading data from the memory array;
    performing first and second error detection operations substantially in parallel; and
    if the first error detection operation does not detect an error and the second error detection operation detects an error, correcting the error with a second error correction operation.

7. The method of claim 6 wherein reading the data from the memory array comprises storing the read data to a data buffer.

8. A method for error detection and correction in a memory device having a memory array, the method comprising:
    reading data from the memory array;
    performing a first error detection operation on the data;
    if an error is detected during the first error detection operation that is correctable by a first error correction operation, correcting the error with the first error correction operation to generate corrected data;
    performing a second error detection operation on the corrected data; and
    if an error is detected during the first error detection operation that is uncorrectable by the first error correction operation, correcting the error with a second error correction operation to generate the corrected data.

9. The method of claim 8 wherein reading data from the memory array comprises loading data from the memory array into a data buffer.

10. The method of claim 9 wherein performing a first error detection operation on the data comprises using a Hamming code error detection method to check the data as the data is loaded into the data buffer.

11. The method of claim 8 and further comprising:
    invoking the second error detection operation if an error is detected during the first error detection operation.

12. The method of claim 8 and further comprising:
    not invoking the second error detection operation if an error is not detected during the first error detection operation.

13. The method of claim 8 and further comprising:
    returning the corrected data to the memory array.

14. A memory device comprising:
    a memory array; and
    a controller circuit that is configured to read data from the memory array, perform a first and a second error detection operation on the read data substantially in parallel and, if the first error detection operation detects an error that is uncorrectable by a first error correction operation and the second error detection operation detects an error, the controller circuit is further configured to correct the error with a second error correction operation.

15. The memory device of claim 14 wherein the memory array is a NAND-type flash memory array.

16. A memory device comprising:
    a memory array having a NOR-type architecture of flash memory cells;
    a data buffer;
    a controller circuit that is configured to read data from the memory array and store the data in the data buffer, perform a first error detection and correction routine that detects errors in the read data and communicates a first error detection result to the controller circuit, and perform a second error detection and correction routine that operates in parallel with the first error detection and correction routine in detecting errors in the read data and communicates a second error detection result to the controller circuit.

17. The memory device of claim 16 wherein the first error detection and correction routine is a Hamming code error detection and correction.

18. A memory device comprising:
   a memory array;
   a data buffer;
   a controller circuit that is configured to read data from the memory array and store the data in the data buffer, perform a first error detection and correction routine that detects errors in the read data and communicates a first error detection result to the controller circuit, perform a second error detection and correction routine that operates in parallel with the first error detection and correction routine in detecting errors in the read data and communicates a second error detection result to the controller circuit,
      wherein the second error detection and correction routine is a Reed-Solomon code error detection and correction routine.

19. The memory device of claim 18 wherein the controller circuit is further configured to perform the first error detection and correction routine and the second error detection and correction routine in series with reading the data.

\* \* \* \* \*